(12) United States Patent
Kim et al.

(10) Patent No.: US 11,430,850 B2
(45) Date of Patent: Aug. 30, 2022

(54) DISPLAY APPARATUS

(71) Applicant: SAMSUNG DISPLAY CO., LTD., Yongin-si (KR)

(72) Inventors: Dongwoo Kim, Yongin-si (KR); Junhyun Park, Yongin-si (KR); Sungjae Moon, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 142 days.

(21) Appl. No.: 16/749,617

(22) Filed: Jan. 22, 2020

(65) Prior Publication Data

US 2020/0235190 A1 Jul. 23, 2020

(30) Foreign Application Priority Data

Jan. 23, 2019 (KR) .................. 10-2019-0008746

(51) Int. Cl.
*H01L 27/32* (2006.01)
*G09G 3/3266* (2016.01)

(52) U.S. Cl.
CPC ....... *H01L 27/3276* (2013.01); *G09G 3/3266* (2013.01); *H01L 27/3253* (2013.01); *H01L 27/3262* (2013.01); *H01L 27/3265* (2013.01)

(58) Field of Classification Search
CPC ............ H01L 27/3276; H01L 27/3253; H01L 27/3262; H01L 27/3265; G09G 3/3266
See application file for complete search history.

(56) References Cited

U.S. PATENT DOCUMENTS

| | | | |
|---|---|---|---|
| 7,221,012 B2 * | 5/2007 | Chu | ............... H01L 27/1244 257/E27.111 |
| 9,980,398 B2 | 5/2018 | Kim et al. | |
| 10,157,969 B2 | 12/2018 | Kwon et al. | |
| 2017/0287995 A1 | 10/2017 | Kim et al. | |
| 2018/0197484 A1 | 7/2018 | Moon et al. | |
| 2018/0197932 A1 | 7/2018 | Ho | |
| 2018/0204899 A1 | 7/2018 | Her | |
| 2018/0205037 A1 | 7/2018 | Kim et al. | |

FOREIGN PATENT DOCUMENTS

| | | |
|---|---|---|
| KR | 10-2017-0115149 | 10/2017 |
| KR | 10-2017-0127109 | 11/2017 |
| KR | 10-2017-0143142 | 12/2017 |
| KR | 10-2018-0082688 | 7/2018 |

* cited by examiner

*Primary Examiner* — Dale E Page
*Assistant Examiner* — Quovaunda Jefferson
(74) *Attorney, Agent, or Firm* — F. Chau & Associates, LLC

(57) ABSTRACT

A display apparatus includes a first signal line and a second signal line that each extend on a substrate in a first direction and are spaced apart in a second direction that crosses the first direction; a plurality of first metal patterns spaced apart from each other in the first direction, wherein at least a portion of the first metal patterns overlaps the first signal line and is electrically connected to the first signal line; and a plurality of second metal patterns spaced apart from each other in the first direction, wherein at least a portion of the second metal patterns overlaps the second signal line and is electrically connected to the second signal line, wherein the plurality of first metal patterns and the plurality of second metal patterns are spaced apart in the first direction in a zigzag arrangement.

18 Claims, 9 Drawing Sheets

DISPLAY APPARATUS

CROSS-REFERENCE TO RELATED APPLICATION

This application claims priority under 35 U.S.C. § 119 from, and the benefit of, Korean Patent Application No. 10-2019-0008746, filed on Jan. 23, 2019 in the Korean Intellectual Property Office, the contents of which are herein incorporated by reference in their entirety.

BACKGROUND

1. Technical Field

One or more embodiments are directed to a display apparatus.

2. Discussion of the Related Art

A display apparatus is an apparatus that visually displays data. A display apparatus includes a substrate partitioned into a display area and a peripheral area. In the display area, scan lines and data lines are insulated from each other and a plurality of pixels are included.

A display apparatus includes thin film transistors respectively corresponding to the pixels in the display area. A driver or a controller, etc., is disposed in the peripheral area to transmit electrical signals to the display area via various lines.

The uses of a display apparatus as described are diversifying. Thus, various designs have been tried to increase the display quality of a display apparatus.

SUMMARY

One or more embodiments include a display apparatus in which defects such as a short circuit between neighboring lines can be prevented.

Additional aspects will be set forth in part in the description which follows and, in part, will be apparent from the description, or may be learned by practice of the presented embodiments.

According to one or more embodiments, a display apparatus includes: a first signal line and a second signal line that each extend on a substrate in a first direction and spaced apart in a second direction that crosses the first direction; a plurality of first metal patterns spaced apart from each other in the first direction, wherein at least a portion of the first metal patterns overlaps the first signal line and is electrically connected to the first signal line; and a plurality of second metal patterns spaced apart from each other in the first direction, wherein at least a portion of the second metal patterns overlaps the second signal line and is electrically connected to the second signal line, wherein the plurality of first metal patterns and the plurality of second metal patterns are spaced apart in the first direction in a zigzag arrangement.

The plurality of second metal patterns may be adjacent in the second direction to portions of the first signal line that are between the plurality of first metal patterns.

A distance between the plurality of first metal patterns in the first direction may be equal to a length of the plurality of second metal patterns in the first direction.

A distance between the plurality of first metal patterns in the first direction may be greater than a length of the plurality of second metal patterns in the first direction.

The plurality of first metal patterns may be spaced apart from each other by equal distances.

The plurality of second metal patterns may be spaced apart from each other by equal distances, wherein a distance between the plurality of second metal patterns in the first direction is equal to a distance between the plurality of first metal patterns in the first direction.

The first signal line may completely overlap at least one of the plurality of first metal patterns.

A width of the plurality of first metal patterns in the second direction may be greater than a width of the first signal line in the second direction.

A second metal pattern of the plurality of second metal patterns that is adjacent to one of the plurality of first metal patterns may be spaced apart from the one of the plurality of first metal patterns in the first direction and the second direction.

The display apparatus may further include at least one insulating layer disposed between the first signal line and the plurality of first metal patterns.

Each of the plurality of first metal patterns may include a first contact plug that penetrates the at least one insulating layer and connects the plurality of first metal patterns to the first signal line.

The first contact plug may be located at both ends of each of the plurality of first metal patterns.

The display apparatus may further include a plurality of display elements, each display element including a thin film transistor and a capacitor that includes a gate electrode of the thin film transistor as a lower electrode.

The first signal line may be disposed on a same layer as the gate electrode of the thin film transistor.

The plurality of first metal patterns may be disposed on a same layer as a source electrode and a drain electrode of the thin film transistor.

The plurality of first metal patterns may be disposed between the gate electrode of the thin film transistor and a source electrode and a drain electrode of the thin film transistor.

The plurality of first metal patterns may be disposed on a same layer as an upper electrode of the capacitor.

The display apparatus may further include a scan driver that is driven via a signal transmitted via each of the first signal line and the second signal line.

According to one or more embodiments, a display apparatus includes a first signal line and a second signal line, each extending on a substrate in a first direction and spaced apart in a second direction that crosses the first direction; a plurality of first metal patterns disposed on the first signal line and spaced apart from each other in the first direction; a plurality of second metal patterns disposed on the second signal line and spaced apart from each other in the second direction; and at least one insulating layer between the first signal line and the plurality of first metal patterns and between the second signal line and the plurality of second metal patterns. The plurality of first metal patterns and the plurality of second metal patterns are spaced apart in the first direction in a zigzag arrangement.

Each of the plurality of first metal patterns may include a first contact plug that penetrates the at least one insulating layer and connects the plurality of first metal patterns to the first signal line, and each of the plurality of second metal patterns may include a second contact plug that penetrates the at least one insulating layer and connects the plurality of second metal patterns to the second signal line.

DETAILED DESCRIPTION

Figure 1:
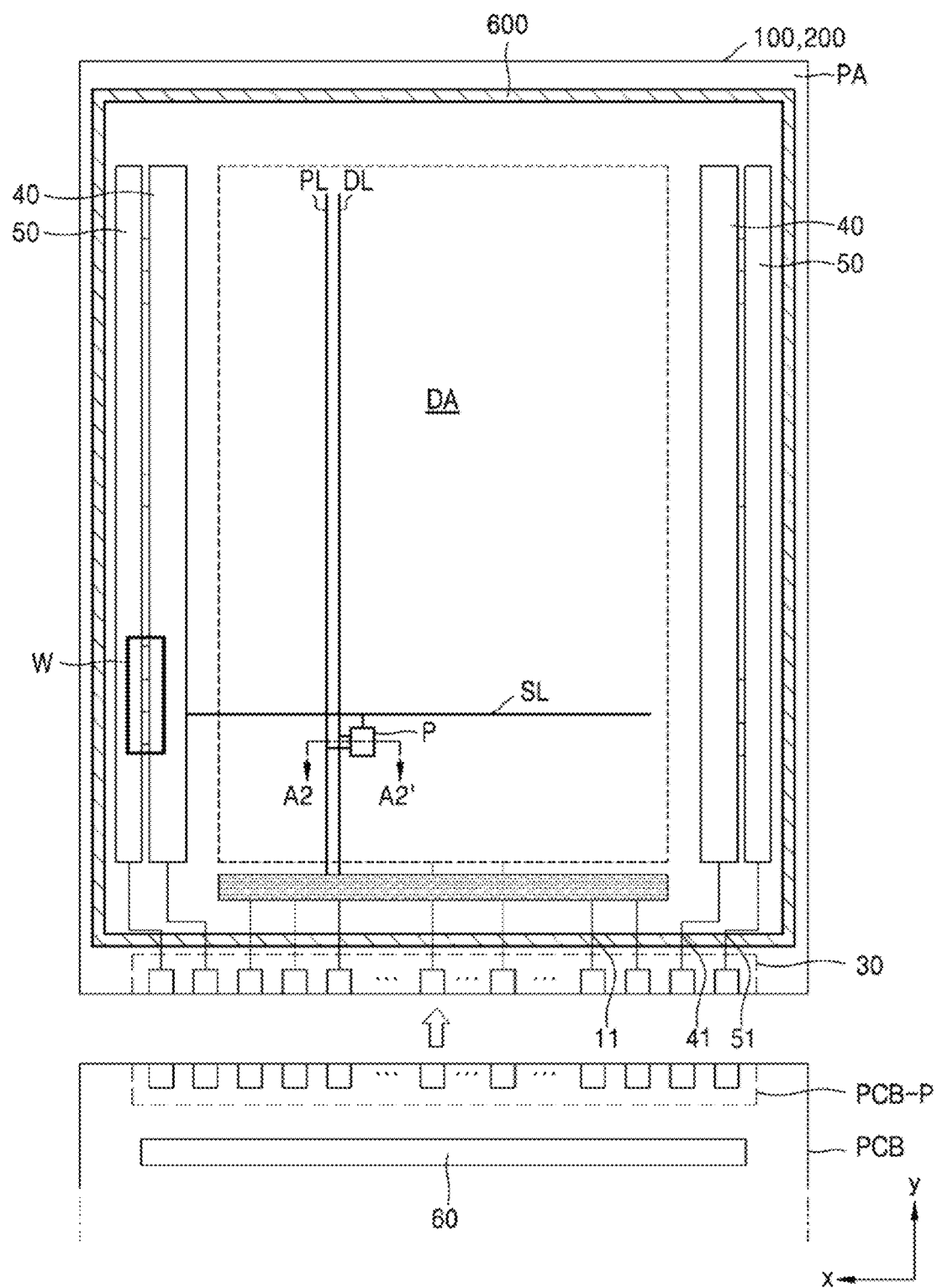
FIG. 1 is a plan view of a display apparatus according to an embodiment.

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein. Accordingly, exemplary embodiments are merely described below, by referring to the figures, to explain aspects of the present description.

In the embodiments below, it will be understood when a portion such as a layer, an area, or an element is referred to as being "on" or "above" another portion, it can be directly on or above the other portion, or intervening portion may also be present.

Hereinafter, embodiments of the present disclosure will be described more fully with reference to the accompanying drawings, in which exemplary embodiments of the present disclosure are shown. In the drawings, like elements may be labeled like reference numerals and repeated description thereof will be omitted. In the drawings, thicknesses of layers and regions may be expanded to clearly illustrate the layers and regions.

FIG. 1 is a plan view of a display apparatus 10 according to an embodiment.

Referring to FIG. 1, according to an embodiment, the display apparatus 10 includes a first substrate 100 adhered to a second substrate 200 by a sealing member 600. The sealing member 600 is formed along peripheral surfaces of the first substrate 100 and/or the second substrate 200 to adhere the first substrate 100 and the second substrate 200 to each other.

According to an embodiment, the display apparatus 10 includes a display area DA and a peripheral area PA around the display area DA. The display apparatus 10 displays an image using light emitted from a plurality of pixels P disposed in the display area DA.

According to an embodiment, each of the pixels P is connected to a scan line SL that extends in a first, x-direction and a data line DL that extends in a second, y-direction that crosses the first, x-direction. Each pixel P is also connected to a driving voltage line PL that extends in the second y-direction.

According to an embodiment, each of the pixels P includes a display element such as an organic light-emitting diode (OLED). Each pixel P emits one of red light, green light, blue light, or white light, through the OLED. In a present specification, the pixels P may be assumed to emit light of any one of the red, green, blue, or white colors as described above.

According to an embodiment, each pixel P is electrically connected to internal circuits disposed in the peripheral area PA. A scan driver 40, a wiring unit 50, and a terminal unit 30, etc., are disposed in the peripheral area PA.

According to an embodiment, the scan driver 40 includes a plurality of thin film transistors and transmits a scan signal to each pixel P via the scan line SI. The scan driver 40 is disposed on both sides of the display area DA with the display area DA therebetween. Some of the pixels P disposed in the display area DA are electrically connected to the scan driver 40 on the left side, and the other pixels P are electrically connected to the scan driver 40 on the right side. According to another embodiment, the scan driver 40 is disposed only on one side of the display area DA.

According to an embodiment, the wiring unit 50 is disposed at a side of the scan driver 40. The wiring unit 50 is an area in which lines for transmitting scan driving signals to the scan driver 40 are disposed. The scan driving signals include a gate start signal and a plurality of clock signals, and as the scan driving signals are transmitted to the scan driver 40, the scan driver 40 generates scan signals that are transmitted to the pixels P.

According to an embodiment, the terminal unit 30 is disposed at a side of the first substrate 100. The terminal unit 30 is not covered by an insulating layer but exposed and electrically connected to a printed circuit board PCB. A terminal PCB-P of the printed circuit board PCB is electrically connected to the terminal unit 30.

According to an embodiment, the printed circuit board PCB transmits a controller signal or power to the terminal unit 30. The controller provides a driving voltage ELVDD and a common voltage ELVSS, shown in FIG. 2 to be described below, to power supply lines via a first connection line 11. The driving voltage ELVDD is provided to each pixel P via the driving voltage line PL connected to a first power supply line, and the common voltage ELVSS is provided to an opposite electrode 223, shown in FIG. 4, of each pixel P connected to a second power supply line. The second power supply line has a loop shape with one open side and that partially surrounds the display area DA. The second power supply line is disposed between the scan driver 40 and the display area DA. The second power supply line transmits a common voltage and is thus referred to as a common voltage supply line.

According to an embodiment, a control signal generated in the controller is transmitted to the scan driver 40 and the wiring unit 50 through third and fourth connection lines 41 and 51 via the printed circuit board PCB. A signal transmitted to the wiring unit 50 is transmitted to the scan driver 40.

According to an embodiment, a data driver 60 is electrically connected to the data line DL. The data driver 60 transmits data signals to each pixel P through the fourth connection line 51 connected to the terminal unit 30 and the data line DL connected to the fourth connection line 51. FIG. 1 illustrates the data driver 60 as being disposed on the printed circuit board PCB. According to another embodiment, the data driver 60 is also disposed on the first substrate 100. For example, the data driver 60 can be disposed between the terminal unit 30 and the first power supply line.

Figure 2:
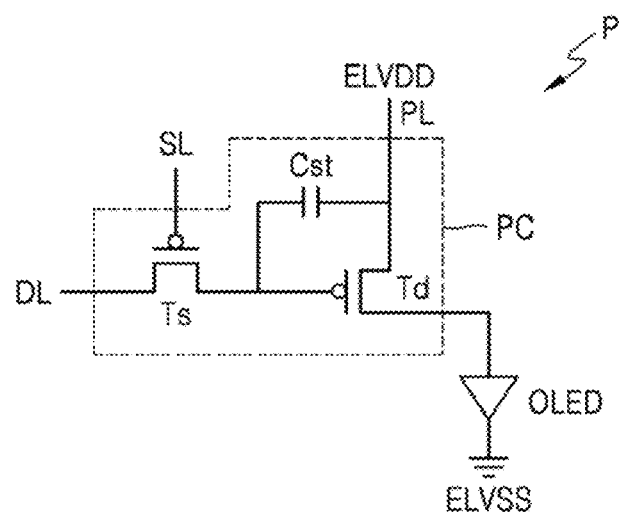
FIG. 2 is an equivalent circuit diagram of a pixel included in a display apparatus of FIG. 1.

FIG. 2 is an equivalent circuit diagram of a pixel included in a display apparatus 10 of FIG. 1.

Referring to FIG. 2, according to an embodiment, a pixel P includes a pixel circuit PC connected to the scan line SL and the data line DL and a display element connected to the pixel circuit PC. The display element includes, for example, an organic light-emitting diode OLED.

According to an embodiment, the pixel circuit PC includes a driving thin film transistor Td, a switching thin film transistor Ts, and a storage capacitor Cst. The switching thin film transistor Ts is connected to the scan line SL and the data line DL and transmits a data signal received via the data line DL to the driving thin film transistor Td, according to a scan signal received via the scan line SL. The storage capacitor Cst is connected to the switching thin film transistor Ts and a driving voltage line PL, and stores a voltage corresponding to a difference between a voltage received from the switching thin film transistor Ts and a driving voltage ELVDD received from the driving voltage line PL.

According to an embodiment, the driving thin film transistor Td is connected to the driving voltage line PL and the storage capacitor Cst, and controls, in accordance with a voltage value stored in the storage capacitor Cst, a driving current that flows through the driving voltage line PL to the organic light-emitting diode OLED. The organic light-emitting diode OLED emits light having a certain brightness due to the driving current. The organic light-emitting diode OLED may emit, for example, red, green, blue, or white light.

However, while the pixel P that includes two thin film transistors and one storage capacitor is described with reference to FIG. 2, embodiments of the present disclosure are not limited thereto. According to other embodiments, various other modifications can be made; for example, a pixel circuit PC of a pixel P may include three or more thin film transistors or two or more storage capacitors.

Figure 3:
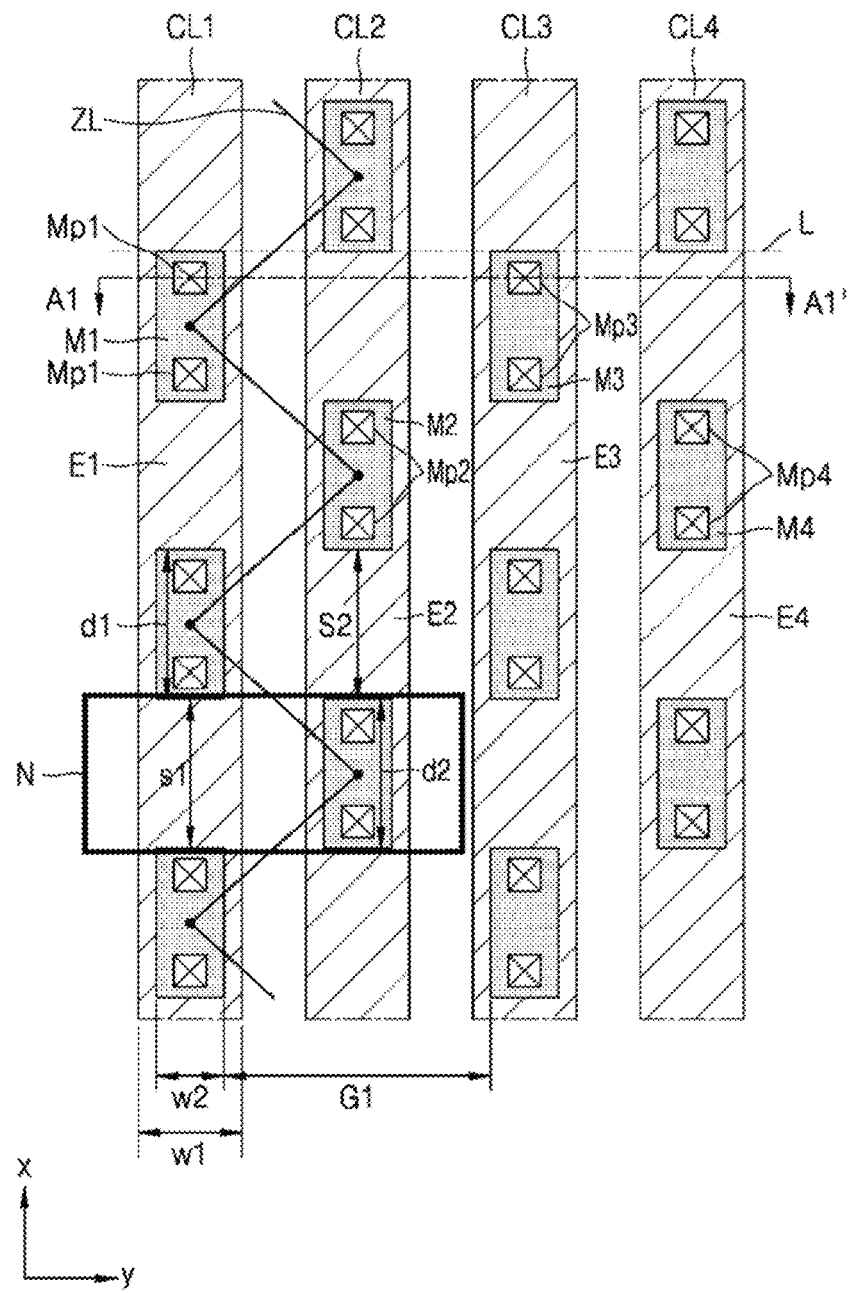
FIG. 3 is an expanded plan view of a region W of FIG. 1.
Figure 4:
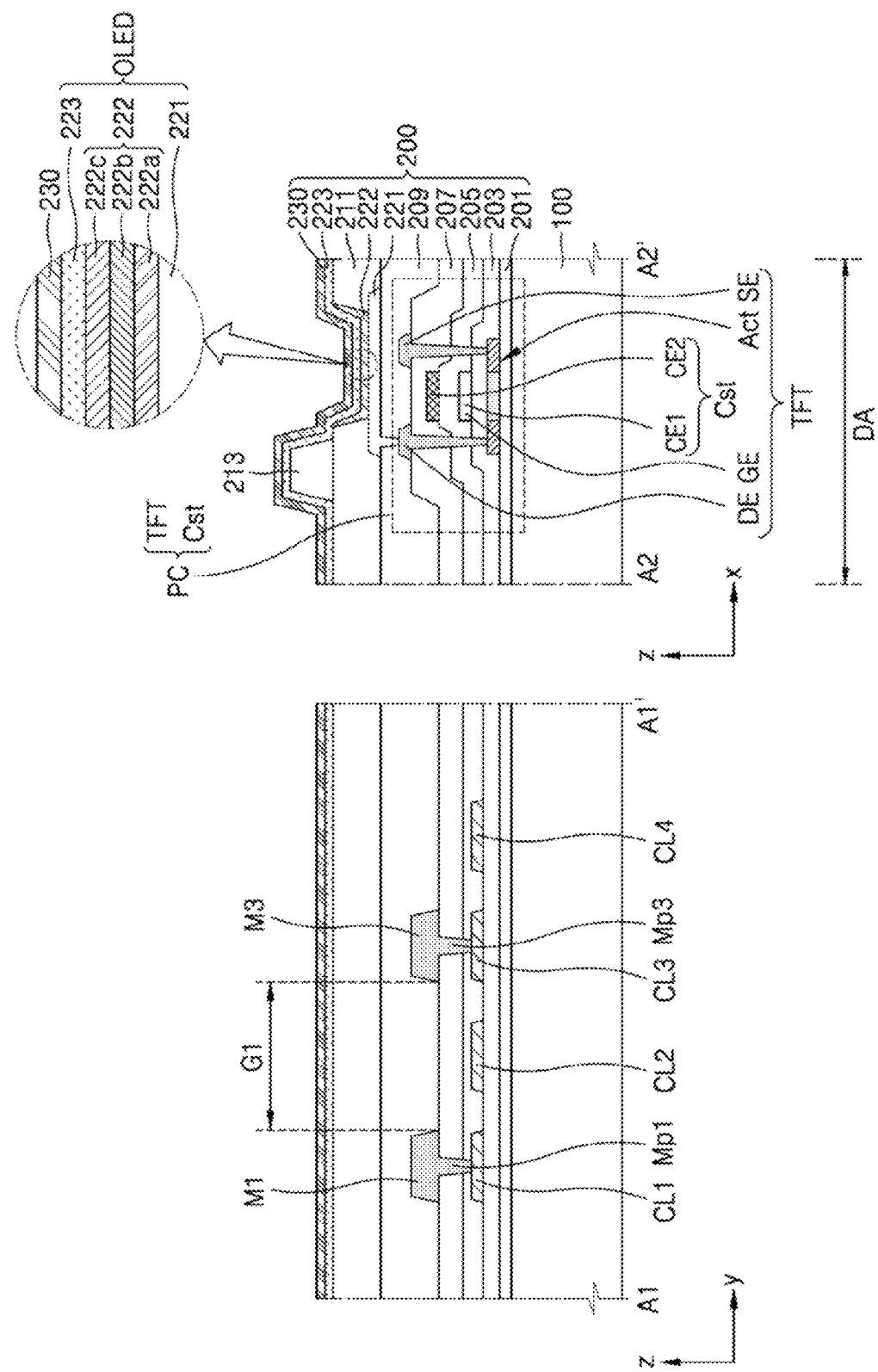
FIG. 4 is a cross-sectional view of portions cut along line A1-A1' of FIG. 3 and line A2-A2' of FIG. 1.

FIG. 3 is an expanded plan view of a region W of FIG. 1, and FIG. 4 is a cross-sectional view cut along line A1-A1' of FIG. 3 and line A2-A2' of FIG. 1.

First, according to an embodiment, referring to FIG. 3, a plurality of signal lines CL1, CL2, CL3, and CL4 are disposed on the substrate 100 of the display apparatus 10. The plurality of signal lines CL1, CL2, CL3, and CL4 transmit signals for driving the scan driver 40 to the scan driver 40.

According to an embodiment, FIG. 3 illustrates four signal lines CL1, CL2, CL3, and CL4, that is, a first signal line CL1, a second signal line CL2, a third signal line CL3, and a fourth signal line CL4. However, embodiments are not limited thereto, and more that four lines can be connected to the scan driver 40.

According to an embodiment, the plurality of signal lines CL1, CL2, CL3, and CL4 illustrated in FIG. 3 are neighboring lines and each extend in the first direction. The first direction is an x-direction, which is substantially parallel to a length direction of the scan line SL as illustrated in FIG. 1. However, embodiments of the present disclosure are not limited thereto, and the first direction can be a y-direction that is substantially parallel to a length direction of the data line DL, or a third direction that differs from the x-direction and the y-direction. Hereinafter, for convenience of description, the first direction is assumed to be the x-direction and the second direction crossing the first direction is assumed to be the y-direction.

In addition, according to an embodiment, the plurality of signal lines CL1, CL2, CL3, and CL4 are spaced apart in a y-direction, and whose an order in a +y-direction is the first signal line CL1, the second signal line CL2, the third signal line CL3, and the fourth signal line CL4.

According to an embodiment, on the first signal line CL1, a plurality of first metal patterns M1 are disposed that are spaced apart from each.

In detail, according to an embodiment, at least some of the plurality of first metal patterns M1 overlap the first signal line CL1, and the plurality of first metal patterns M1 and the first signal line CL1 are electrically connected to each other.

Like the first signal line CL1, according to an embodiment, a plurality of second metal patterns M2 that are spaced apart from each other are disposed on the second signal line CL2 that is closest to the first signal line CL1. At least some of the plurality of second metal patterns M2 overlap the second signal line CL2 and are electrically connected to the second signal line CL2.

According to an embodiment, the plurality of first metal patterns M1 that overlap the first signal line CL1 and the plurality of second metal patterns M2 that overlap the second signal line CL2 are alternately arranged, thereby preventing defects such as short circuits between two adjacent metal patterns M1 and M2.

That is, according to an embodiment, the plurality of first metal patterns M1 and the plurality of second metal patterns M2 are respectively disposed in the x-direction in a zigzag arrangement. In other words, a zigzag line ZL is formed when centers of the plurality of first metal patterns M1 and centers of the plurality of second metal patterns M2 are sequentially connected.

According to an embodiment, as illustrated in a region N, the plurality of second metal patterns M2 are adjacent to a first portion E1 between the plurality of first metal patterns M1 of the first signal line CL1 in the y-direction. Likewise, the plurality of first metal patterns M1 are adjacent to a second portion E2 between the plurality of second metal patterns M2 of the second signal line CL2 in the y-direction. Accordingly, at least some of the first metal patterns M1 and at least some of the second patterns M2 are not adjacent to each other and thus short circuits, etc., between two metal patterns M1 and M2 can be prevented.

Accordingly, according to an embodiment, to better prevent a short circuit, portions of the first metal patterns M1 adjacent to the second metal patterns M2 are eliminated or minimized.

In detail, according to an embodiment, the first metal patterns M1 and the second metal patterns M2 are adjacent to a virtual line L that extends in the y-direction in FIG. 3, and are disposed on opposite sides with respect to the virtual line L. For example, as illustrated in FIG. 3, an edge of each of the first metal patterns M1 and the second metal patterns M2 contacts the virtual line L. Alternatively, edges of the first metal patterns M1 and the second metal patterns M2 are spaced apart from the virtual line L. However, some of the first metal patterns M1 and some of the second metal patterns M2 can be adjacent to each other, and in this case, a ratio of each of the first metal patterns M1 and the second metal patterns M2 that are adjacent each other is less than 50%.

According to an embodiment, the plurality of first metal patterns M1 are spaced apart from each other by equal distances. A distance s1 between the plurality of first metal patterns M1 in the x-direction and a length d1 of the plurality of first metal patterns M1 in the x-direction may be equal or different.

In addition, according to an embodiment, the plurality of second metal patterns M2 are also spaced apart from each other by equal distances, and a distance s2 between the plurality of second metal patterns M2 in the x-direction and a length d2 of the plurality of second metal patterns M2 in the x-direction may be equal or different.

The distance s2 between the plurality of second metal patterns M2 is equal to the distance s1 between the plurality of first metal patterns M1.

In addition, according to an embodiment, as illustrated in region N of FIG. 3, the distance s1 between the plurality of first metal patterns M1 in the x-direction is equal to the length d2 of the plurality of second metal patterns M2 in the x-direction.

According to an embodiment, the distance s1 between the plurality of first metal patterns M1 is constant in the x-direction, and the distance s2 between the plurality of second metal patterns M2 is also constant in the x-direction. When the distance s1 is equal to the distance s2, the length d1 of the first metal patterns M1 and the distance s1 between the first metal patterns M1 in the x-direction and the length d2 of the plurality of second metal patterns M2 and the distance s2 between the second metal patterns M2 in the x-direction are all equal.

However, according to an embodiment, when the plurality of first metal patterns M1 overlap the first signal line CL1, the first signal line CL1 completely overlaps at least one of the plurality of first metal patterns M1. That is, as illustrated in FIG. 3, at least one of the plurality of first metal patterns M1 is within an area on the substrate 100 where the first signal line CL1 is disposed. In this case, a width w2 of the first metal patterns M1 in the y-direction is less than a width w1 of the first signal line CL1 in the y-direction.

According to an embodiment, while the first metal patterns M1 on the first signal line CL1 and the second metal patterns M2 on the second signal line CL2 are described as an example, a structure of neighboring signal lines and metal patterns thereon also applies to third metal patterns M3 on the third signal line CL3 and fourth metal patterns M4 on the fourth signal line CL4.

Next, according to an embodiment, referring to FIG. 4, as the plurality of first metal patterns M1 and the plurality of second metal patterns M2 are disposed in a zigzag arrangement as illustrated in FIG. 3, a metal pattern is spaced apart from the first metal patterns M1 by a first distance G1. That is, by providing a gap corresponding to the first distance G1 between two adjacent metal patterns, i.e., the first metal patterns M1 and the third metal patterns M3, a short circuit, etc., can be prevented.

According to an embodiment, the metal patterns spaced apart from the first metal patterns M1 by the first distance G1 are the third metal patterns M3 that overlap the third signal line CL3. While FIG. 3 illustrates the first metal patterns M1 and the third metal patterns M3 as being separated by the first distance G1, the second metal patterns M2 and the fourth metal patterns M4 are also separated by the first distance G1.

As illustrated in FIG. 4, according to an embodiment, at least one insulating layer is disposed between the plurality of signal lines CL1, CL2, CL3, and CL4 and the plurality of first and third metal patterns M1 and M3, etc. Hereinafter, elements arranged in the display area DA will be described with reference to the cross-section taken along line A2-A2' of FIG. 1, and the first through fourth signal lines CL1 to CL4 and the first and third metal patterns M1 and M3, etc. and an insulating layer disposed therebetween will be described in detail.

According to an embodiment, referring to the cross-section taken along A2-A2', a pixel circuit PC and an organic light-emitting diode OLED electrically connected to the pixel circuit PC are disposed in the display area DA.

According to an embodiment, a thin film transistor TFT, a storage capacitor Cst and a pixel electrode 221 electrically connected thereto are formed on the substrate 100. The pixel circuit PC is disposed on the substrate 100, and the organic light-emitting diode OLED is disposed on the pixel circuit PC.

According to an embodiment, the substrate 100 includes a polymer resin. The polymer resin may include, for example, polyethersulphone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), or cellulose acetate propionate (CAP), etc., and accordingly, the substrate 100 is flexible.

According to another embodiment, the substrate 100 includes a glass material that includes $SiO_2$ as a main component or a resin such as a reinforced plastic and is rigid. According to another embodiment, the substrate 100 is a stacked structure that includes a layer that includes the above-described polymer resin and a barrier layer disposed on the polymer resin layer, and in this case, the flexibility of the substrate 100 can be increased. The barrier layer may include silicon nitride ($SiN_x$), silicon oxynitride (SiON), or silicon oxide ($SiO_x$).

According to another embodiment, a buffer layer 201 is formed on the substrate 100 that prevents impurities from penetrating into a semiconductor layer Act of the thin film transistor TFT. The buffer layer 201 may include an inorganic insulation material such as silicon nitride ($SiN_x$), silicon oxynitride (SiON), or silicon oxide ($SiO_x$), and may be a single layer or a multi-layer structure that includes the above-described inorganic insulation material.

According to an embodiment, the pixel circuit PC is disposed on the buffer layer 201. The pixel circuit PC includes the thin film transistor TFT and the storage capacitor Cst. The thin film transistor TFT includes the semiconductor layer Act, a gate electrode GE, a source electrode SE, and a drain electrode DE. The thin film transistor TFT illustrated in FIG. 4 may correspond to the driving thin film transistor Td described with reference to FIG. 2 or a light emission control thin film transistor. In a present embodiment, FIG. 4 illustrates a top gate-type thin film transistor in which the gate electrode GE is disposed on the semiconductor layer Act with a gate insulating layer 203 disposed between the gate electrode GE and the semiconductor layer Act. However, according to another embodiment, the thin film transistor TFT is a bottom gate-type thin film transistor.

According to an embodiment, the semiconductor layer Act includes polysilicon. However, according to other embodiments, the semiconductor layer Act includes amorphous silicon, an oxide semiconductor, or an organic semiconductor, etc. The gate electrode GE includes a low-resistance metal. For example, the gate electrode GE includes a conductive metal such as molybdenum (Mo), aluminum (Al), copper (Cu), or titanium (Ti), etc., and may be formed as a multi-layered structure or a single layer that includes the above-described material.

According to an embodiment, the gate insulating layer 203 disposed between the semiconductor layer Act and the gate electrode GE includes an inorganic insulation material such as silicon oxide, silicon nitride, silicon oxynitride, aluminum oxide, titanium oxide, tantalum oxide, or hafnium oxide, etc. The gate insulating layer 203 may be a single layer or a multi-layered structure that includes the above-described material.

According to an embodiment, the source electrode SE and the drain electrode DE include a highly conductive material. The source electrode SE and the drain electrode DE include a conductive metal such as molybdenum (Mo), aluminum (Al), copper (Cu), or titanium (Ti), etc., and may be formed as a multi-layered structure or a single layer that includes the above-described material. In an embodiment, the source electrode SE and the drain electrode DE include a multi-layer of Ti/Al/Ti.

According to an embodiment, the storage capacitor Cst includes a lower electrode CE1 and an upper electrode CE2, which overlap each other with a first interlayer insulating layer 205 therebetween. The storage capacitor Cst overlaps the thin film transistor TFT. In this regard, FIG. 4 illustrates the gate electrode GE of the thin film transistor TFT as the lower electrode CE1 of the storage capacitor Cst. In other embodiments, the storage capacitor Cst does not overlap the thin film transistor TFT. The storage capacitor Cst is covered by a second interlayer insulating layer 207.

According to an embodiment, the first and second interlayer insulating layers 205 and 207 include an inorganic insulation material such as silicon oxide, silicon nitride, silicon oxynitride, aluminum oxide, titanium oxide, tantalum oxide, or hafnium oxide, etc. The first and second interlayer insulating layers 205 and 207 may include a single layer or a multi-layered structure that includes the above-described material.

According to an embodiment, the pixel circuit PC includes the thin film transistor TFT and the storage capacitor Cst and is covered by a planarization insulating layer 209. The planarization insulating layer 209 has a substantially flat upper surface. The planarization insulating layer 209 may include a general-use polymer such as polymethylmethacrylate (PMMA) or polystyrene (PS), a polymer derivative that includes a phenolic group, an acrylic polymer, an aryl ether polymer, an amide polymer, a fluorine polymer, a p-xylene polymer, a vinyl alcohol-based polymer, or a blend thereof. In an embodiment, the planarization insulating layer 209 includes polyimide. In other embodiments, the planarization insulating layer 209 may include an inorganic insulation material or inorganic and organic insulation materials.

According to an embodiment, the pixel electrode 221 id formed on the planarization insulating layer 209. The pixel electrode 221 includes a conductive oxide such as indium tin oxide (ITO), indium zinc oxide (IZO), zinc oxide (ZnO), indium oxide ($In_2O_3$), indium gallium oxide (IGO) or aluminum zinc oxide (AZO). In other embodiments, the pixel electrode 221 includes a reflective layer that includes silver (Ag), magnesium (Mg), aluminum (Al), platinum (Pt), palladium (Pd), gold (Au), nickel (Ni), neodymium (Nd), iridium (Ir), chromium (Cr), or a compound thereof. In other embodiments, the pixel electrode 221 further includes a film formed of ITO, IZO, ZnO, or $In_2O_3$ on or under the above-described reflective layer.

According to an embodiment, a pixel defining layer 211 is formed on the pixel electrode 221. The pixel defining layer 211 includes an opening that exposes an upper surface of the pixel electrode 221 and cover edges of the pixel electrode 221. The pixel defining layer 211 includes an organic insulation material. In another embodiment, the pixel defining layer 211 includes an inorganic material such as silicon nitride ($SiN_x$), silicon oxynitride (SiON), or silicon oxide ($SiO_x$). In other embodiments, the pixel defining layer 211 includes an organic insulation material and an inorganic insulation material.

According to an embodiment, an intermediate layer 222 that includes an emissive layer 222b is formed on the upper surface of the pixel electrode 221 exposed by the opening in the pixel defining layer 211. The intermediate layer 222 includes a first functional layer 222a disposed under the emissive layer 222b and/or a second functional layer 222c disposed on the emissive layer 222b. The emissive layer 222b includes a polymer or a low-molecular-weight organic material that emits light of a predefined color.

According to an embodiment, the first functional layer 222a may include a single layer or multiple layers. For example, when the first functional layer 222a is formed of a polymer material, the first functional layer 222a is a hole transport layer (HTL) that has a single-layer structure and is formed of poly-(3,4)-ethylene-dihydroxy thiophene (PEDOT) or polyaniline (PANI). When the first functional layer 222a is formed of a low-molecular-weight material, the first functional layer 222a includes a hole injection layer (HIL) and a hole transport layer (HTL).

The second functional layer 222c may be omitted. According to an embodiment, when the first functional layer 222a and the emissive layer 222b are formed of a polymer material, the second functional layer 222c is formed. The second functional layer 222c may include a single layer or multiple layers. The second functional layer 222c may include an electron transport layer (ETL) and/or an electron injection layer (EIL).

According to an embodiment, the first functional layer 222a and/or the second functional layer 222c of the intermediate layer 222 are commonly formed in all pixels. The emissive layer 222b is individually arranged in each pixel in the display area DA. The emissive layer 222b is disposed within the opening of the pixel defining layer 211.

According to an embodiment, the opposite electrode 223 is formed of a conductive material that has a low work function. For example, the opposite electrode 223 includes a (semi)transparent layer that includes Ag, Mg, Al, Pt, Pd, Au, Ni, Nd, Ir, Cr, Li, Ca or an alloy thereof. In another embodiment, the opposite electrode 223 further includes a material such as ITO, IZO, ZnO or $In_2O_3$ on the (semi)transparent layer that includes the above-described material. The opposite electrode 223 is formed not only in the display area DA but also in the peripheral area PA. The intermediate layer 222 and the opposite electrode 223 can be formed using a thermal deposition method.

According to an embodiment, a capping layer 230 is disposed on the opposite electrode 223. The capping layer 230 includes LiF and is formed by a thermal deposition method. In another embodiment, the capping layer 230 includes an inorganic insulation material such as silicon nitride ($SiN_x$), silicon oxynitride (SiON), or silicon oxide ($SiO_x$). In another embodiment, the capping layer 230 is omitted.

According to an embodiment, a spacer 213 is formed on the pixel defining layer 211. The spacer 213 includes an organic insulation material such as polyimide. In another embodiment, the spacer 213 may include an inorganic insulation material such as silicon nitride or silicon oxide, or may include an organic insulation material and an inorganic insulation material.

According to an embodiment, the spacer 213 includes a different material from the pixel defining layer 211. In another embodiment, the spacer 213 includes a same material as the pixel defining layer 211, and in this embodiment, the pixel defining layer 211 and the spacer 213 are formed together in a mask process using a halftone mask, etc. In an embodiment, the pixel defining layer 211 and the spacer 213 include polyimide.

Referring to the cross-section taken along A1-A1' and the cross-section taken along A2-A2' of FIG. 4, according to an embodiment, the plurality of signal lines CL1, CL2, CL3, and CL4 are disposed on a same layer as the gate electrode GE of the thin film transistor TFT. That is, the plurality of signal lines CL1, CL2, CL3, and CL4 are arranged on the gate insulating layer 203, which is on a same layer as the scan lines SL described with reference to FIGS. 1 and 2.

In addition, according to an embodiment, the plurality of first and third metal patterns M1 and M3, etc., are disposed on a same layer as the source electrode SE and the drain electrode DE of the thin film transistor TFT and are disposed on a same layer as the data lines DL described with reference to FIGS. 1 and 2. While FIG. 4 illustrates only the first metal patterns M1 and the third metal patterns M3 in the cross-section taken along line A1-A1', the second metal patterns M2 and the fourth metal patterns M4 that are respectively adjacent to the first metal patterns M1 and the third metal patterns M3 are also disposed on a same layer as the source electrode SE and the drain electrode DE of the thin film transistor TFT.

According to an embodiment, at least one insulating layer is disposed between the plurality of signal lines CL1, CL2, CL3, and CL4 and the plurality of metal M1, M3, M2 and M4, and the at least one insulating layer includes the first interlayer insulating layer 205 and the second interlayer insulating layer 207.

Here, according to an embodiment, the plurality of metal patterns M1, M3, M2 and M4 are electrically connected to the plurality of signal lines CL1, CL2, CL3, and CL4 that are on different layers.

For example, according to an embodiment, each of the plurality of first metal patterns M1 includes a first contact plug Mp1 at both ends thereof, and the first metal patterns M1 are connected to the first signal line CL1 located under the plurality of first metal patterns M1 via the first contact plugs Mp1.

In detail, according to an embodiment, the first contact plug Mp1 penetrates the first and second interlayer insulating layers 205 and 207, and to this end, holes corresponding to the first contact plugs Mp1 are formed in the first and second interlayer insulating layers 205 and 207.

Accordingly, according to an embodiment, a scan driving signal that includes a clock signal that alternately flows through the first portion E of the first signal line CL1 and the first metal patterns M1 to be transmitted to the scan driver 40. The scan driving signal flows through the first signal line CL1 at a lower level, moves up to the first metal pattern M1 at a higher level via a first contact plug Mp1, flows along the first metal patterns M1 in the first, x-direction, and comes down to the first signal line CL1 at the lower level again via another first contact plug Mp1. During this process, a signal is transmitted using two metal layers, i.e., the first signal line CL1 and the first metal patterns M1, thus reducing wiring load compared to single-layer wiring.

In addition, according to an embodiment, a second contact plug Mp2 that connects the second signal line CL2 and the second metal patterns M2, a third contact plug Mp3 that connects the third signal line CL3 and the third metal patterns M3, or a fourth contact plug Mp4 that connects the fourth signal line CL4 and the fourth metal patterns M4, etc., may also be used to transmit a signal in the same manner as the first contact plug Mp1 as the signal moves up and down in the first direction (x-direction) via the second contact plug Mp2, the third contact plug Mp3, or the fourth contact plug Mp4.

Figure 5:
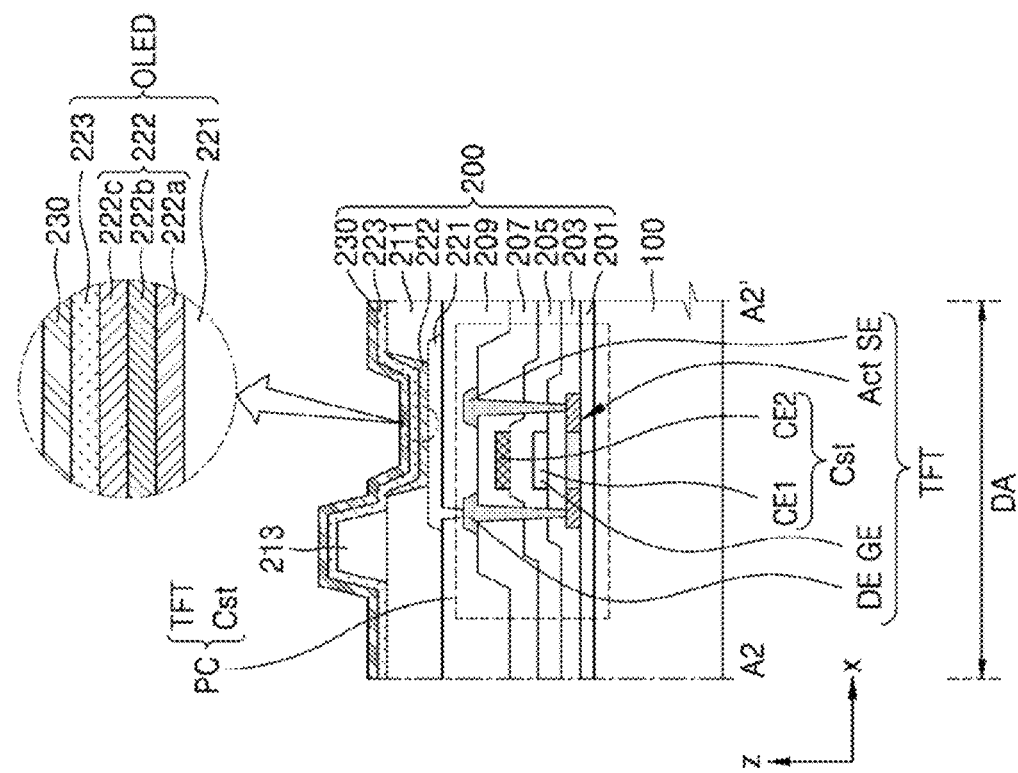
FIG. 5 is a cross-sectional view of a portion of a display apparatus according to an embodiment.
Figure 5:
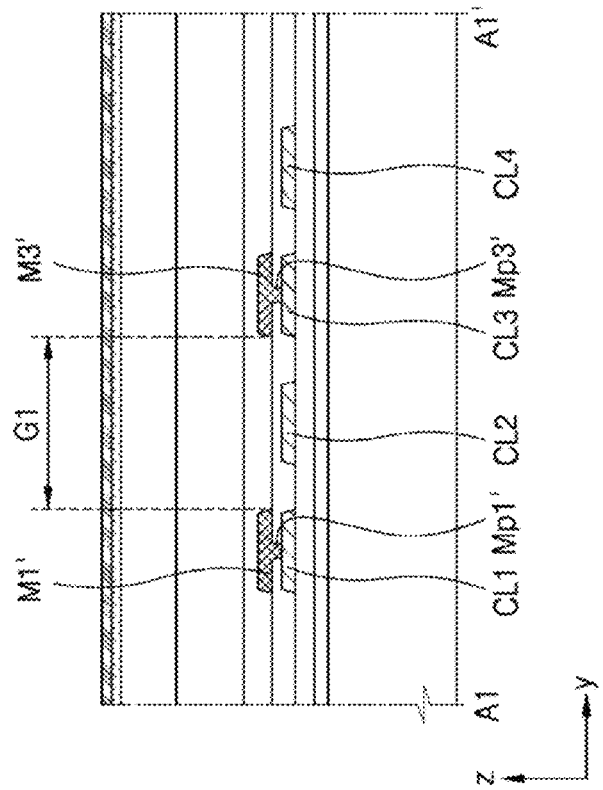

FIG. 5 is a cross-sectional view of a portion of a display apparatus according to another embodiment.

In an embodiment illustrated in FIG. 5, details are identical or similar to those illustrated in an embodiment of FIG. 4 except for positions of a plurality of metal patterns on layers, such as the first metal patterns M1, the third metal patterns M3, etc. of FIG. 4.

In addition, a structure of a plan view corresponding to the cross-section taken along line A1-A1' of FIG. 5 is identical to that of an embodiment of FIG. 3. Accordingly, features related to positions of the metal patterns on layers will be described below, and for description of the other features, the above-provided description may be referred to.

Referring to both the cross-section taken along A1-A1' and the cross-section taken along A2-A2' of FIG. 5, according to an embodiment, the plurality of signal lines CL1, CL2, CL3, and CL4 are disposed on a same layer as the gate electrode GE of the thin film transistor TFT as in an embodiment illustrated in FIG. 4. That is, the plurality of signal lines CL1, CL2, CL3, and CL4 are disposed on the gate insulating layer 203, which is on a same layer as the scan lines SL described with reference to FIGS. 1 and 2.

However, unlike an embodiment illustrated in FIG. 4, a plurality of metal patterns, such as first metal patterns M1' and third metal patterns M3', etc., are disposed between the gate electrode GE of the thin film transistor TFT and the source electrode SE and the drain electrode DE.

According to an embodiment, a plurality of first metal patterns M1' are disposed on a same layer as the upper electrode CE2 of the storage capacitor Cst in the pixel circuit PC. The first metal patterns are on a same layer as the scan lines SL or on a same layer as the data lines DL.

According to an embodiment while FIG. 5 illustrates only the first metal patterns M1' and the third metal patterns M3' in the cross-section taken along A1-A1', other metal patterns that respectively overlap the second signal line CL2 and the fourth signal line CL4 are also further disposed on a same layer as the upper electrode CE2 of the storage capacitor Cst.

According to an embodiment, at least one insulating layer is disposed between the plurality of signal lines CL1, CL2, CL3, and CL4 and the plurality of metal patterns M1' and M3' etc., and the at least one insulating layer includes the first interlayer insulating layer 205. As the number of insulating layers disposed between the plurality of signal lines CL1, CL2, CL3, and CL4 and the plurality of metal patterns M1' and M3', etc., is reduced, a length of a first contact plug Mp1' and a second contact plug Mp2' that are respectively included in the plurality of metal patterns M1' and M3', etc., can be reduced.

In addition, according to an embodiment, to easily transmit a scan driving signal moving up and down between lines on different layers to the scan driver 40, resistance in a plurality of metal patterns M1, M2, M3, and M4 on the lines should be reduced. Hereinafter, various embodiments that can reduce resistance in the plurality of metal patterns M1, M2, M3, and M4 will be described in detail with reference to FIGS. 6 through 9.

Figure 6:
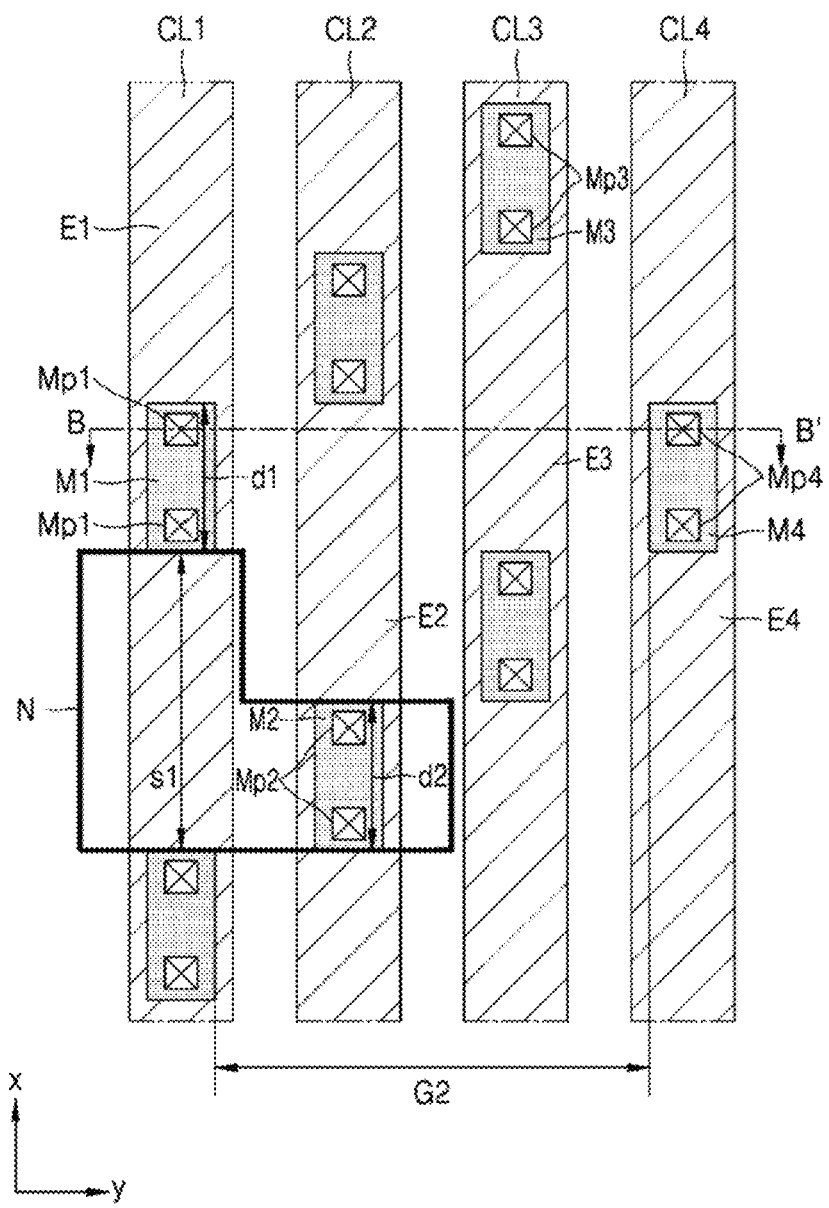
FIG. 6 is an expanded plan view of a region W of FIG. 1 according to an example.
Figure 7:
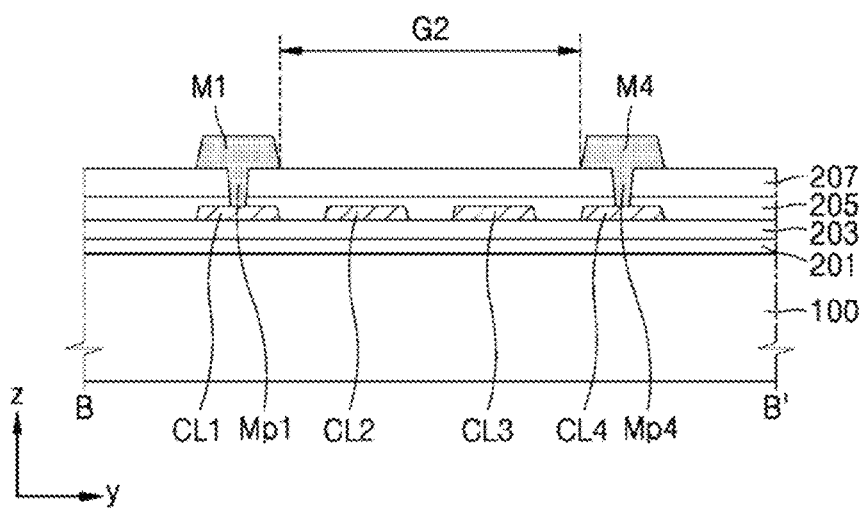
FIG. 7 is a cross-sectional view cut along line B-B' of FIG. 6.

FIG. 6 is an expanded plan view of the region W of FIG. 1, according to an embodiment, and FIG. 7 is a cross-sectional view cut along line B-B' of FIG. 6.

In an embodiment illustrated in FIGS. 6 and 7, details are identical to or similar to those illustrated in FIGS. 3 and 4 except for a length of a distance, such as the distance s1, etc., between a plurality of metal patterns, such as the first and third metal patterns M1 and M3 of FIG. 4. Accordingly, features related to the distances between the metal patterns will be described below, and for description of the other features, the above-provided description may be referred to.

First, according to an embodiment, referring to region N of FIG. 6, the plurality of second metal patterns M2 are adjacent to the first portion E1 between the plurality of first metal patterns M1 of the first signal line CL1 in the y-direction, as in an embodiment illustrated in FIG. 3. Likewise, the plurality of first metal patterns M1 are adjacent to the second portion E2 between the plurality of second metal patterns M2 of the second signal line CL2 in the y-direction.

Unlike an embodiment of FIG. 3, the distance s1 between the plurality of first metal patterns M1 in the x-direction differs from the length d2 of the plurality of second metal patterns M2 in the x-direction.

For example, according to an embodiment, the distance s1 between the plurality of first metal patterns M1 in the x-direction is greater than the length d2 of the plurality of second metal patterns M2 in the x-direction. Accordingly, an average distance between the first metal patterns M1 about one second metal pattern M2 is increased, thus further reducing the possibility of a short circuit between the first and second metal patterns M1 and M2.

While FIG. 6 illustrates the second metal patterns M2 as offset from a center portion of the first portion E1 between the plurality of first metal patterns M1 in the first signal line CL1 in the region N, embodiments of the present disclosure are not limited thereto. In another embodiment, the second metal patterns M2 are positioned with respect to a center portion of the first portion E1 of the first signal line CL1.

According to an embodiment, while the first metal patterns M1 on the first signal line CL1 and the second metal patterns M2 on the second signal line CL2 are described as an example, the structure of neighboring signal lines and metal patterns on the signal lines also applies to the third metal patterns M3 on the third signal line CL3 and the fourth metal patterns M3 on the fourth signal line CL4.

Next, referring to a cross-section taken along B-B' of FIG. 7, according to an embodiment, the plurality of signal lines CL1, CL2, CL3, and CL4 are disposed on a same layer as the gate electrode GE of the thin film transistor TFT as in an embodiment illustrated in FIG. 4. In addition, the plurality of metal patterns M1 and M3, etc., are also disposed on a same layer as the source electrode SE and the drain electrode DE of the thin film transistor TFT as in the embodiment illustrated in FIG. 4.

However, according to an embodiment illustrated in FIGS. 3 and 4, a first distance G1 between neighboring first and third metal patterns M1 and M3 or the second and fourth metal patterns M2 and M4 in a y-direction is constant regardless of which position the plan view of FIG. 3 is cut.

On the other hand, according to a present embodiment, when a display apparatus is cut at a position corresponding to line B-B' of FIG. 6, the first metal patterns M1 and the fourth metal patterns M4 are exposed on a cross-section. A second distance G2 between the neighboring first and fourth metal patterns M1 and M4 in the y-direction is greater than the first distance G1 described above.

According to an embodiment, by increasing the distance s1 between the plurality of metal patterns, such as the first metal patterns M1, a relatively long distance between neighboring metal patterns can be provided.

In addition, according to an embodiment, the plurality of metal patterns M1, M2, M3, and M4 can be disposed on a different layer from the source electrode SE and the drain electrode DE of the thin film transistor TFT. For example, the plurality of metal patterns M1, M2, M3, and M4 of FIG. 7 can be disposed on a same layer as the upper electrode CE2 of the storage capacitor Cst.

Figure 8:
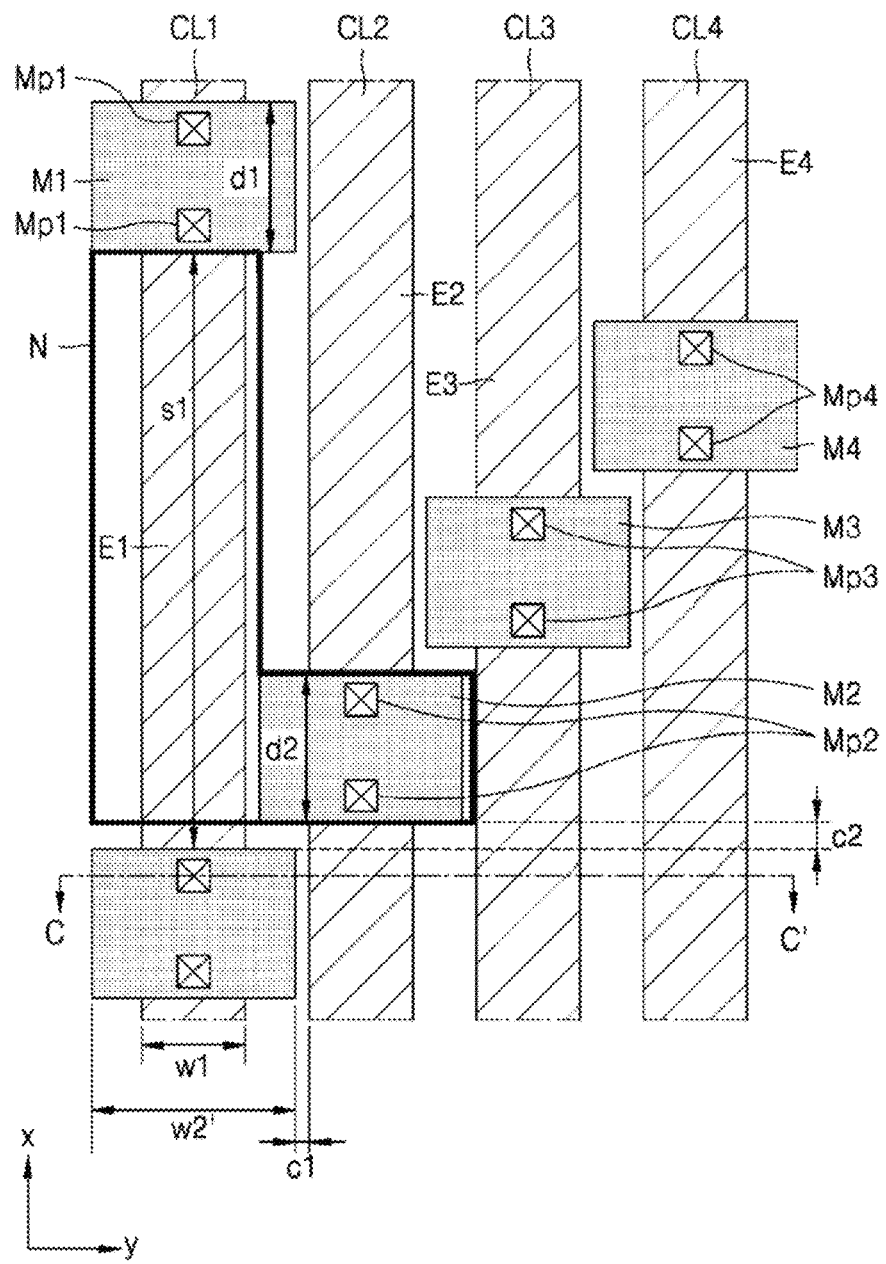
FIG. 8 is an expanded plan view of the region W of FIG. 1 according to an example.
Figure 9:
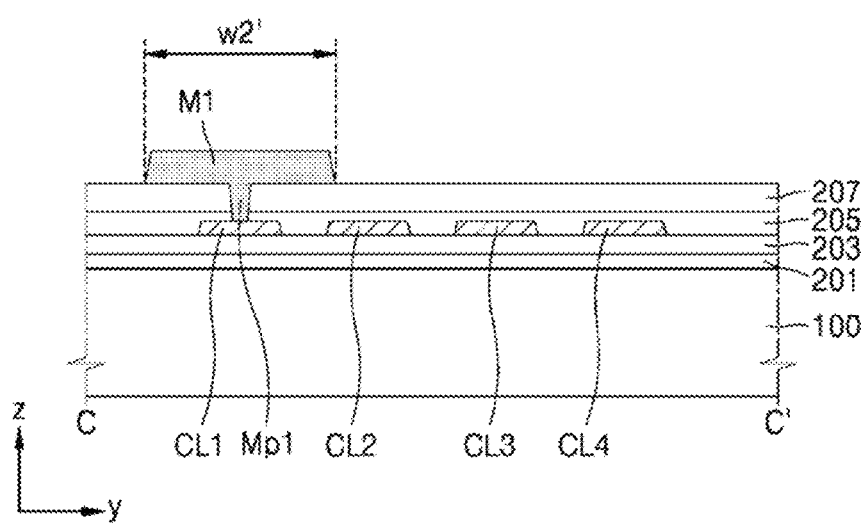
FIG. 9 is a cross-sectional view cut along line C-C' of FIG. 8.

FIG. 8 is an expanded plan view of the region W of FIG. 1, according to another embodiment, and FIG. 9 is a cross-sectional view cut along line C-C' of FIG. 8.

In an embodiment illustrated in FIGS. 8 and 9, details are identical or similar to those illustrated in FIGS. 3 and 4, except for a width of the plurality of metal patterns M1, M2, M3, and M4. Accordingly, features related to the widths of the metal patterns will be described below, and for description of the other features, the above-provided description may be referred to.

Referring to both FIGS. 8 and 9, according to an embodiment, the plurality of metal patterns M1, M2, M3, and M4 have a greater width than the plurality of signal lines CL1, CL2, CL3, and CL4 that are overlapped by the plurality of metal patterns M1, M2, M3 and M4. In detail, in the first metal patterns M1, for example, a width w2' of the first metal patterns M1 in the y-direction is greater than the width w1 of the first signal line CL1 in the y-direction.

According to an embodiment, as the width of the plurality of metal patterns M1, M2, M3, and M4 increases as described above, electric resistance of the metal patterns M1, M2, M3, and M4 is reduced, thus further facilitating signal transmission.

However, a gap between neighboring metal patterns decreases, and thus, although the metal patterns have a zigzag arrangement on two neighboring signal lines, the possibility of a short circuit may not be reduced.

Accordingly, according to a present embodiment, a distance between a plurality of metal patterns that overlap one signal line is further increased compared to embodiments illustrated in FIG. 3 or FIG. 6.

According to an embodiment, in the first metal patterns M1, for example, a distance s1 between the plurality of first metal patterns M1 is greater than the distance s1 illustrated in FIG. 3 or the distance s1 illustrated in FIG. 6.

In addition, according to an embodiment, a first clearance c1 is included such that an edge of the first metal patterns M1 by the second signal line CL2 is spaced apart from the second signal line CL2 in the y-direction, and a second clearance c2 is included such that an edge of the first metal patterns M1 by the second metal patterns M2 is spaced apart from the second metal patterns M2 in the x-direction. Here, by spacing the first metal patterns M1 from the second signal line CL2 by the first clearance c1, and by spacing the first metal patterns M1 from the second metal patterns M2 by the second clearance c2, parasitic capacitance that can occur between the first metal patterns M1 and the second signal line CL2, or between the first metal patterns M1 and the second metal patterns M2, can be reduced.

According to an embodiment, the above-described structure also applies to the third metal patterns M3 on the third signal line CL3 and the fourth metal patterns M4 on the fourth signal line CL4.

In a present embodiment, instead of reducing an electric resistance of the plurality of metal patterns M1, M2, M3, and M4 by increasing widths of the plurality of metal patterns M1, M2, M3, and M4, a distance between neighboring metal patterns or a distance between a metal pattern and a line adjacent to the metal pattern, such as the distance s1, the first clearance c1, the second clearance c2, etc., is increased to reduce the possibility of a short circuit.

In addition, according to other embodiments, the plurality of metal patterns M1, M2, M3, and M4 can be disposed on a different layer from the source electrode SE and the drain electrode DE of the thin film transistor TFT. For example, the plurality of metal patterns as in FIG. 9 can be disposed on a same layer as the upper electrode CE2 of the storage capacitor Cst.

Moreover, as in an embodiment illustrated in FIG. 3, for example, a combination of a signal line overlapped by a metal pattern by a relatively small width, such as in an embodiment of FIG. 3 where w2<w1, and a signal line overlapped by a metal pattern by a relatively great width, such as in an embodiment of FIG. 8 where w2'>w1, may also be used.

According to embodiments of the present disclosure as described above, short circuit defects occurring between neighboring lines can be prevented.

In addition, a display quality can be increased by reducing wiring load.

However, the scope of exemplary embodiments of the present disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first signal line and a second signal line, each extending on a substrate in a first direction and spaced apart in a second direction that crosses the first direction;
   a plurality of first metal patterns spaced apart from each other in the first direction, wherein at least a portion of the first metal patterns overlaps the first signal line and is electrically connected to the first signal line;
   a plurality of second metal patterns spaced apart from each other in the first direction, wherein at least a portion of the second metal patterns overlaps the second signal line and is electrically connected to the second signal line; and
   a plurality of display elements, wherein each display element includes a thin film transistor and a capacitor that includes a gate electrode of the thin film transistor as a lower electrode,
   wherein the plurality of first metal patterns and the plurality of second metal patterns are spaced apart in the first direction in a zigzag arrangement, wherein the zigzag arrangement extends in the first direction, and
   the first signal line is disposed on a same layer as the gate electrode of the thin film transistor.

2. The display apparatus of claim 1, wherein the plurality of second metal patterns are adjacent in the second direction to portions of the first signal line that are between the plurality of first metal patterns.

3. The display apparatus of claim 1, wherein a distance between the plurality of first metal patterns in the first direction is equal to a length of the plurality of second metal patterns in the first direction.

4. The display apparatus of claim 1, wherein a distance between the plurality of first metal patterns in the first direction is greater than a length of the plurality of second metal patterns in the first direction.

5. The display apparatus of claim 1, wherein the plurality of first metal patterns are spaced apart from each other by equal distances.

6. The display apparatus of claim 1, wherein the plurality of second metal patterns are spaced apart from each other by equal distances, wherein a distance between the plurality of second metal patterns in the first direction is equal to a distance between the plurality of first metal patterns in the first direction.

7. The display apparatus of claim 1, wherein the first signal completely overlaps at least one of the plurality of first metal patterns.

8. The display apparatus of claim 1, wherein a width of the plurality of first metal patterns in the second direction is greater than a width of the first signal line in the second direction.

9. The display apparatus of chum 8, wherein a second metal pattern of the plurality of second metal patterns that is adjacent to one of the plurality of first metal patterns is spaced apart from the one of the plurality of first metal patterns in the first direction and the second direction.

10. The display apparatus of claim 1, further comprising at least one insulating layer disposed between the first signal line and the plurality of first metal patterns.

11. The display apparatus of claim 10, wherein each of the plurality of first metal patterns comprises a first contact plug that penetrates the at least one insulating layer and connects the plurality of first metal patterns to the first signal line.

12. The display apparatus of claim 11, wherein the first contact plug is located at both ends of each of the plurality of first metal patterns.

13. The display apparatus of claim 1, wherein the plurality of first metal patterns are disposed on a same layer as a source electrode and a drain electrode of the thin film transistor.

14. The display apparatus of claim 1, wherein the plurality of first metal patterns are disposed between the gate electrode of the thin film transistor and a source electrode and a drain electrode of the thin film transistor.

15. The display apparatus of claim 1, wherein the plurality of first metal patterns are disposed on a same layer as an upper electrode of the capacitor.

16. The display apparatus of claim 1, further comprising a scan driver that is driven via a signal transmitted via each of the first signal line and the second signal line.

17. A display apparatus comprising:
   a first signal line and a second signal line, each extending on a substrate in a first direction and spaced apart in a second direction that crosses the first direction;
   a plurality of first metal patterns disposed on the first signal line and spaced apart from each other in the first direction;
   a plurality of second metal patterns disposed on the second signal line and spaced apart from each other in the second direction;
   a plurality of display elements, wherein each display element includes a thin film transistor and a capacitor that includes a gate electrode of the thin film transistor as a lower electrode; and
   at least one insulating layer between the first signal line and the plurality of first metal patterns and between the second signal line and the plurality of second metal patterns,
   wherein the plurality of first metal patterns and the plurality of second metal patterns are spaced apart in the first direction in a zigzag arrangement, wherein the zigzag arrangement extends in the first direction, and
   the first signal line is disposed on a same layer as the gate electrode of the thin film transistor.

18. The display apparatus of claim 17, wherein
each of the plurality of first metal patterns comprises a first contact plug that penetrates the at least one insulating layer and connects the plurality of first metal patterns to the first signal line, and
each of the plurality of second metal patterns comprises a second contact plug that penetrates the at least one insulating layer and connects the plurality of second metal patterns to the second signal line.

* * * * *